(12) United States Patent
Liu et al.

(10) Patent No.: US 8,884,279 B2
(45) Date of Patent: Nov. 11, 2014

(54) OLED DISPLAY DEVICE AND METHOD FOR FABRICATING THE SAME

(71) Applicant: Innolux Corporation, Chu-Nan (TW)

(72) Inventors: Cheng-Hsiung Liu, Chu-Nan (TW); Hsin-Yuan Su, Chu-Nan (TW); Hsiang-Lun Hsu, Chu-Nan (TW)

(73) Assignee: Innolux Corporation, Chu-Nan (TW)

( * ) Notice: Subject to any disclaimer, the term of this patent is extended or adjusted under 35 U.S.C. 154(b) by 0 days.

(21) Appl. No.: 13/795,646

(22) Filed: Mar. 12, 2013

(65) Prior Publication Data

US 2013/0277647 A1   Oct. 24, 2013

(30) Foreign Application Priority Data

Apr. 24, 2012   (TW) .............................. 101114476 A

(51) Int. Cl.
- *H01L 51/52* (2006.01)
- *H01L 51/56* (2006.01)
- *H01L 33/08* (2010.01)

(52) U.S. Cl.
CPC ................ *H01L 51/52* (2013.01); *H01L 51/56* (2013.01); *H01L 33/08* (2013.01)

USPC .............................................. 257/40; 438/26

(58) Field of Classification Search
CPC ........................... H01L 51/5246; H01L 51/525
USPC ......................................... 257/40; 438/27, 28
See application file for complete search history.

(56) References Cited

U.S. PATENT DOCUMENTS

| 6,175,186 B1* | 1/2001 | Matsuura et al. | 313/483 |
| 2007/0170839 A1* | 7/2007 | Choi et al. | 313/500 |

* cited by examiner

*Primary Examiner* — Daniel Shook
(74) *Attorney, Agent, or Firm* — Liu & Liu

(57) ABSTRACT

An OLED display device is provided, which includes a first substrate, an OLED layer, a first blocking material, a second substrate, and a second blocking material. The first substrate has a first lateral surface, and the second substrate has a second lateral surface. The OLED layer is disposed between the first and second substrates. The first blocking material is disposed at a peripheral region of the OLED layer to connect the first and second substrates. The second blocking material is disposed on the first and second lateral surface and covers a gap between the first and second lateral surfaces.

8 Claims, 4 Drawing Sheets

OLED DISPLAY DEVICE AND METHOD FOR FABRICATING THE SAME

CROSS REFERENCE TO RELATED APPLICATIONS

This Application claims priority of Taiwan Patent Application No. 101114476, filed on Apr. 24, 2012, the entirety of which is incorporated by reference herein.

BACKGROUND

1. Field of the Invention

The disclosure relates to an organic light emitting diode (OLED) display device and a method for fabricating the same, and in particular relates to an OLED display having a lower water/oxygen vapor transmission rate (WVTR/OTR) and a method for fabricating the same.

2. Description of the Related Art

An organic light emitting diode (OLED) refers to a semiconductor device which is capable of converting electric energy into light energy and has advantages of self-luminescence, slimness, high contrast, short response time (within a few microseconds), wide viewing angles, low power consumption, wide working temperature ranges, panel flexibility, and so forth. Hence, the OLED is frequently applied to a number of electronic products.

However, performance of the OLED is decayed by moisture and oxygen, and therefore it is necessary to further encapsulate the OLED during integration of the OLED to prevent entry of moisture and oxygen. In order to block moisture and oxygen in the atmosphere, in a conventional method for fabricating an OLED display device, the glass frit is applied on the inner surfaces of two substrates, and the OLED display device is pre-heated to 500° C. to combine the two substrates. The electronic components in the two substrates may be damaged during the heating process causing a reduction of manufacturing yield. Therefore, this issue should be resolved for developing a better OLED display device and fabricating method for the same.

SUMMARY

In light of the foregoing, one of the disclosed embodiments is to provide an OLED display device with better moisture and oxygen blocking ability.

In one exemplary embodiment, the OLED display device includes a first substrate, an OLED layer, a first blocking material, a second substrate, and a second blocking material. The first substrate has a first lateral surface, and the second substrate has a second lateral surface. The OLED layer is disposed between the first and second substrates. The first blocking material is disposed at a peripheral region of the OLED layer to connect the first and second substrates. The second blocking material is disposed on the first and second lateral surface and covers a gap between the first and second lateral surfaces.

In another embodiment, the first blocking material and the second blocking material are separated by a distance. Namely, there is no contact between the first blocking material and the second material.

In another embodiment, the first substrate further has a first outer surface, and the second substrate further has a second outer surface, and the height of the second blocking material is less than the distance between the first outer surface and the second outer surface. Moreover, the thickness of the second blocking material is in a range from 1 μm to 5 mm.

In another embodiment, the first blocking material is composted of a UV glue and second blocking material is composted of a glass frit.

In one exemplary embodiment, a method for fabricating an OLED display includes: providing a first substrate, wherein an OLED layer is deposited on the first substrate; applying a first blocking material around the OLED layer; providing a second substrate and placing the second substrate on the first substrate; curing the first blocking material, to combine the first substrate and the second substrate together; applying a second blocking material on lateral sides of the first substrate and the second substrate; and hardening the second blocking material.

In another embodiment, prior to the step of applying the second blocking material, the method for fabricating an OLED display further includes providing a low-moisture and low oxygen content processing environment so as to block moisture and oxygen in the atmosphere from the OLED layer.

BRIEF DESCRIPTION OF THE DRAWINGS

The present invention is more fully understood by reading the subsequent detailed description and examples with references made to the accompanying drawings, wherein.

DETAILED DESCRIPTION

The following description is of an embodiment of carrying out the invention. This description is made for the purpose of illustrating the general principles of the invention and should not be taken in a limiting sense.

Figure 1:
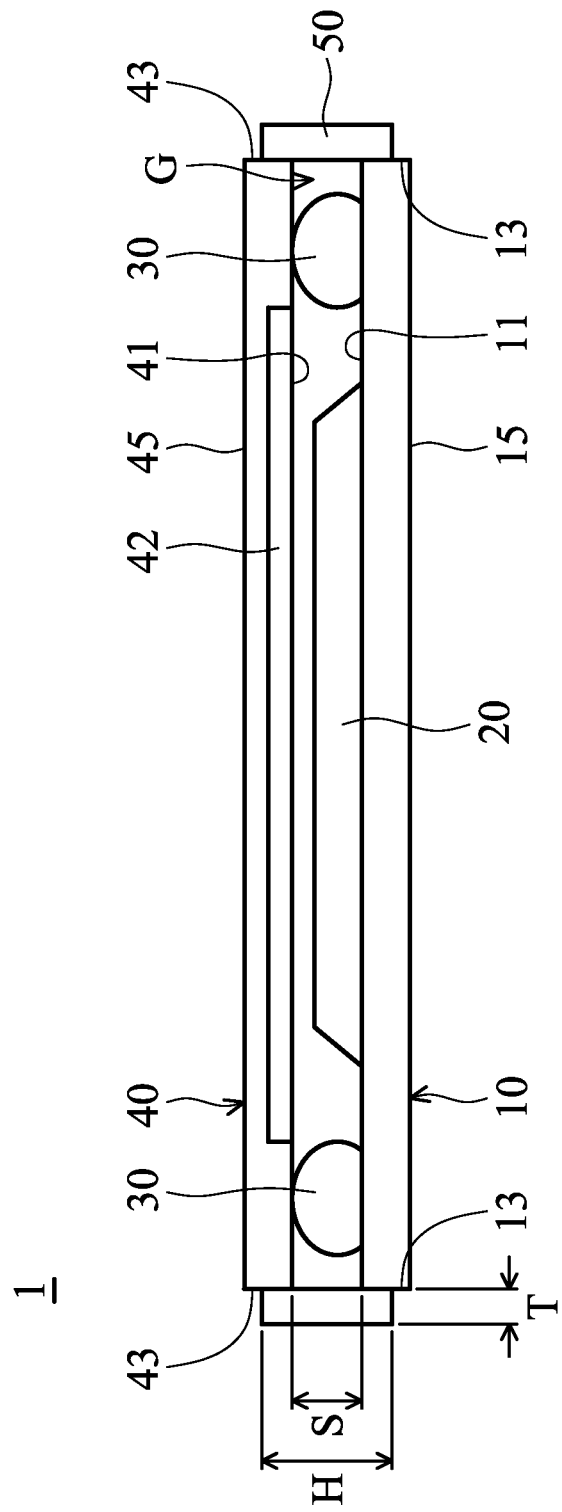
FIG. 1 is a cross sectional diagram of an OLED display device of an embodiment of the present application.

Referring to FIG. 1 an OLED display device 1 of an embodiment of the present invention includes a first substrate 10, an OLED (organic light emitting diode) layer 20, a first blocking material 30, a second substrate 40 and a second blocking material 50.

The first substrate 10 is a transparent substrate with a first inner surface 11, a first lateral surface 13 and a first outer surface 15, wherein the first inner surface 11 is opposite to the first outer surface 15, and the first lateral surface 13 is connected between the first inner surface 11 and the first outer surface 15. The OLED layer 20 is formed in the substantial central area of the first inner surface 11 of the first substrate 10. In the embodiment, the OLED layer 20 emits white light. In the other embodiment, the OLED layer may emit primary colors of light, red, green and blue (RGB) or any other color of light. Since the OLED layer 20 is well within the knowledge of one skilled in the art, further elaboration will not presented here regarding the OLED layer 20.

The first blocking material 30 is applied on the first inner surface 11 of the first substrate 10 and disposed at a peripheral region of the OLED layer 20. In the embodiment, the first blocking material is a UV glue, an adhesive which is cured upon exposure to UV light.

The second substrate 40 includes a color filter 42, and the second substrate 40 is with a second inner surface 41, a second lateral surface 43 and a second outer surface 45, wherein the second inner surface 41 is opposite to the second outer surface 45, and the second lateral surface 43 is connected between the second inner surface 41 and the second outer surface 45. The second inner surface 41 of the second substrate 40 faces the first inner surface 11 of the first substrate 10 and is connected to the first blocking material 30, such that the OLED layer 20 is disposed in a space defined among the first substrate 10, the second substrate 40 and the first blocking material 30, and the OLED layer 20 is circumferentially surrounded by the first blocking material 30. Note that the first substrate 10 is not in complete contact with the second substrate 40 where a gap S, having a width of 2-10 μm, is formed between the first substrate 10 and the second substrate 40. In another embodiment, if the color of light emitted from the OLED layer is white, the second substrate 40 may simply, for example, be a dummy glass (not shown in the figure) without a color filter formed thereon, but it should not be limited thereto. In still another embodiment, if the OLED layer emits primary colors of light, red, green and blue (RGB) or any other color of light, the second substrate 40 may also simply be a dummy glass (not shown in the figure) without a color filter formed thereon.

The second blocking material 50 is disposed in the outermost edge of the OLED display device 1 for blocking moisture and oxygen transmission through the gap S. Specifically, the second blocking material 50, a glass frit, is applied on the first lateral surface 13 of the first substrate 10, and the second lateral surface 43 of the second substrate 40, as well as the gap S formed between the first substrate 10 and the second substrate 40. Prior to the hardening process of the glass frit, a part of the second blocking material 50 may flow into the gap S resulting in contact between the second blocking material 50 and the first inner surface 11 or the second inner surface 41. However, the second blocking material 50 is not connected to the first blocking material 30. The first blocking material 30 and the second blocking material 50 are separated by a distance G.

In the embodiment, a thickness T of the second blocking material 50 may range from 6 mm to 10 mm. In another embodiment, the portion of the second blocking material 50 outwardly embossed from the first lateral surface 13 of the first substrate 10 and the second lateral surface 43 of the second substrate 40 is with a thickness ranging about from 1 μm to 5 mm (larger than or equaled to 1 μm, and less than or equaled to 5 mm). On the other hand, a height H of the second blocking material 50 is larger than a width of the gap S but less than a distance between the first outer surface 15 of the first substrate 10 and the second outer surface 45 of the second substrate 40, such that the outer edge of the gap S is completely covered by the second blocking material 50, while at the same time the second blocking material 50 may not extrude from the first outer surface 15 and the second outer surface 45.

Figure 2A:
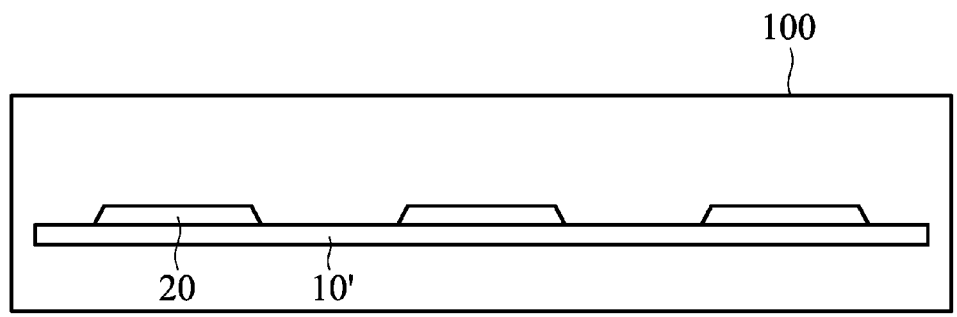
FIGS. 2A-2F are cross sectional diagrams showing the fabricating processes of the OLED display device of the embodiment of the present application.
Figure 2B:
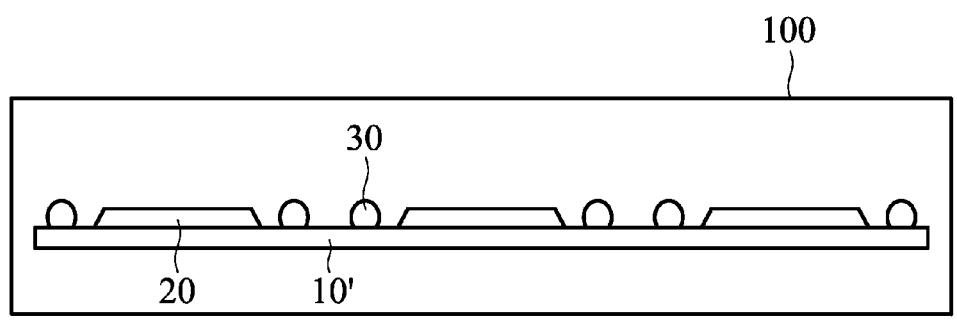
Figure 2C:
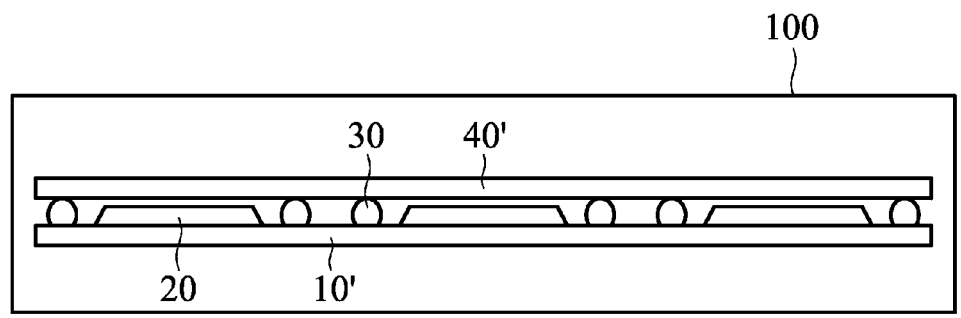
Figure 2D:
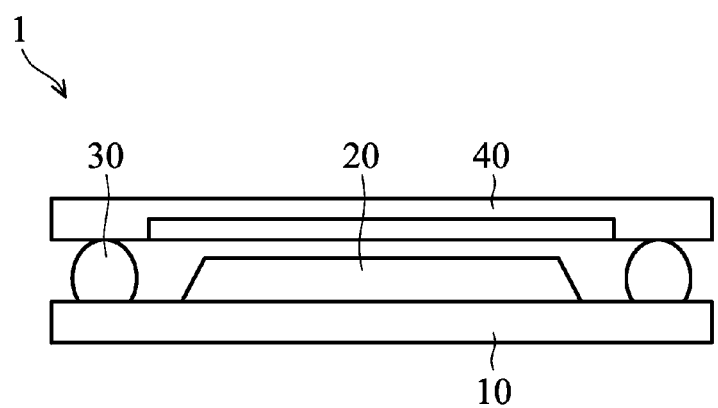
Figure 2E:
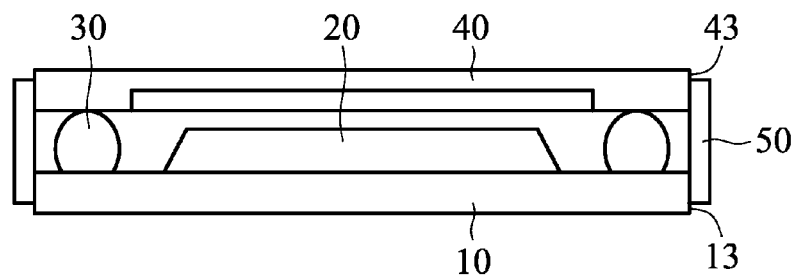
Figure 2F:
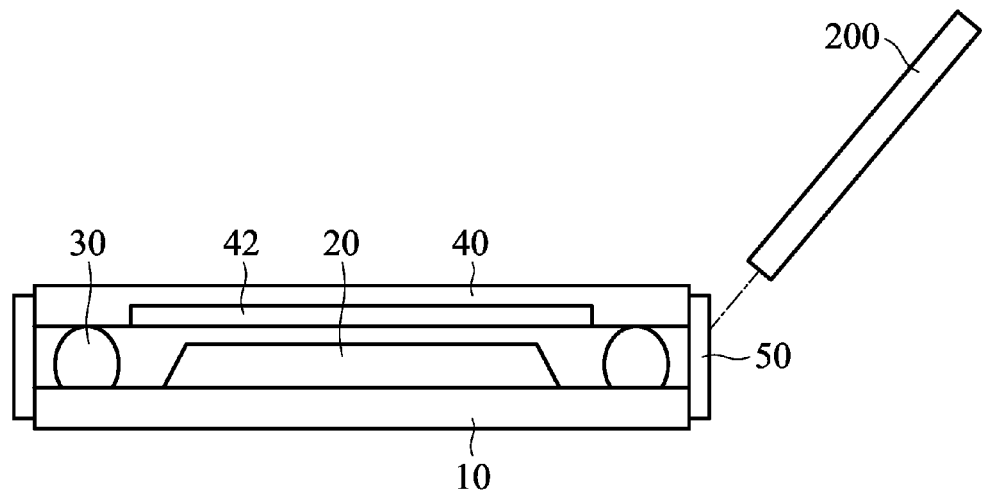

The method for fabricating the OLED display device 1 of the embodiment of the present invention is disclosed. The method for fabricating the OLED display device 1 includes: providing a low-moisture and low oxygen content processing environment, and placing a first glass substrate 10' therein, wherein a plurality of OLED layers 20 are deposited on the first glass substrate 10' (FIG. 2A); applying a first blocking material 30 around each of the OLED layers 20 (FIG. 2B); providing a second glass substrate 40', and placing the second glass substrate 40' on the first glass substrate 10', wherein the second glass substrate 40' is connected to the first glass substrate 10' via the first blocking material 30 (FIG. 2C); curing the first blocking material 30 by a UV light (not shown) in the processing environment 100 to seal the first glass substrate 10' and the second glass substrate 40'; removing the first glass substrate 10', the second glass substrate 40', and the OLED layers 20 from the processing environment 100 and cutting the assembly thereof to form a plurality of OLED display devices 1 (FIG. 2D); applying a second blocking material 50 on the first lateral surface 13 of the first substrate 10 and the second lateral surface 43 of the second substrate 40 (FIG. 2E); and hardening the second blocking material 50 by laser device 200 (FIG. 2F).

It is noted that while the OLED display device 1 is divided from the first and second glass substrates 10' and 40', it should not be limited thereto. In another embodiment, each of the OLED display devices can be manufactured individually by the following steps: depositing an OLED layer 20 on a first substrate 10; connecting the first substrate 10 to a second substrate 40 via a first blocking material 30; and applying a second blocking material 50 on a first lateral surface 13 of the first substrate 10 and a second lateral surface 43 of the second substrate 40.

The advantages of the above method are described below. As shown in FIG. 2C, the OLED layer 20 of the OLED display device 1 is deposited in a low-moisture and a low oxygen content space defined among the first substrate 10, the second substrate 40 and the first blocking material 30 before its removal from the processing environment 100. Thus, the OLED layer 20 may not directly be affected by the moisture and oxygen in the atmosphere. Moreover, as shown in FIG. 2E, only the second blocking material 50 is processed by the laser device 200 such that damage of the color filter 42 formed on the second substrate 40 due to high temperature may not occur. Also, if the second substrate is simply a dummy glass, the fabricating process thereof may be further simplified through the above method.

The OLED display device of the present invention utilizes the first and second blocking materials to block moisture and oxygen in the atmosphere providing a significant reduction in water vapor transmission rate (WVTR). Moreover, through the arrangement where the second blocking material 50 is applied on the outermost edge of the OLED display device the manufacturing efficiency and manufacturing yield of the OLED display device may be further improved.

While the invention has been described by way of example and in terms of the embodiment, it is to be understood that the invention is not limited thereto. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. An OLED display device, comprising:
a first substrate, having a first lateral surface;
a second substrate, having a second lateral surface;
an OLED layer, disposed between the first substrate and the second substrate;
a first blocking material, disposed at a peripheral region of the OLED layer to connect the first substrate with the second substrate, wherein the first blocking material comprises a UV glue; and
a second blocking material, disposed on the first and the second lateral surfaces and covering a gap formed between the first substrate and the second substrate, wherein the second blocking material comprises a glass frit.

2. The OLED display device as claimed in claim 1, wherein the first blocking material and the second blocking material are separated by a distance.

3. The OLED display device as claimed in claim 1, wherein a thickness of the second blocking material is in a range from 1 μm to 5 mm.

4. The OLED display device as claimed in claim 1, wherein the first substrate further has a first outer surface, and the second substrate further has a second outer surface, and a height of the second blocking material is less than a distance between the first outer surface and the second outer surface.

5. The OLED display device as claimed in claim 1, wherein the color of the light emitted from the OLED layer is white.

6. The OLED display device as claimed in claim 1, wherein the second substrate comprises a color filter.

7. A method for fabricating an OLED display device, comprising:
- providing a first substrate, wherein an OLED layer is deposited on the first substrate;
- applying a first blocking material at a peripheral region of the OLED layer;
- providing a second substrate and placing the second substrate on the first substrate;
- curing the first blocking material by a UV light, to combine the first substrate and the second substrate together;
- applying a second blocking material on lateral sides of the first substrate and the second substrate; and
- hardening the second blocking material by a laser.

8. The method for fabricating an OLED display device as claimed in claim 7, prior to the step for applying the second blocking material, further comprising providing a low-moisture and low oxygen content processing environment so as to block moisture and oxygen in the atmosphere from the OLED layer.

* * * * *